(12) United States Patent
Antoniou

(10) Patent No.: US 8,887,381 B2
(45) Date of Patent: Nov. 18, 2014

(54) METHOD OF MAKING A 3-D STRUCTURE

(75) Inventor: Nicholas Antoniou, Boston, MA (US)

(73) Assignee: Nicholas Antoniou, Boston, MA (US)

( * ) Notice: Subject to any disclaimer, the term of this patent is extended or adjusted under 35 U.S.C. 154(b) by 1111 days.

(21) Appl. No.: 12/799,352

(22) Filed: Apr. 21, 2010

(65) Prior Publication Data
US 2010/0314353 A1 Dec. 16, 2010

Related U.S. Application Data

(60) Provisional application No. 61/171,403, filed on Apr. 21, 2009.

(51) Int. Cl.
H05K 3/30 (2006.01)
B82B 3/00 (2006.01)
B82Y 30/00 (2011.01)
B82Y 40/00 (2011.01)

(52) U.S. Cl.
CPC . *B82B 3/00* (2013.01); *B82Y 30/00* (2013.01); *B82Y 40/00* (2013.01); *Y10S 977/847* (2013.01); *Y10S 977/888* (2013.01)
USPC ............... 29/832; 29/825; 977/847; 977/888

(58) Field of Classification Search
USPC ............... 29/825, 832; 977/847, 888
See application file for complete search history.

(56) References Cited

U.S. PATENT DOCUMENTS 5,364,497 A 11/1994 Chau et al.
7,297,946 B2 11/2007 Xi et al.
2005/0176228 A1 8/2005 Fonash et al.
2007/0020445 A1 1/2007 Liu et al.
2007/0138705 A1 6/2007 Mickelson et al.

FOREIGN PATENT DOCUMENTS

WO 02-12443 A2 2/2002

OTHER PUBLICATIONS

Characteristics of Nano-Electrostatic Actuator Fabricated by Focused Ion Beam Chemical Vapor Deposition by R. Kumetani et al, a paper in Japanese J. Appl Physics, vol. 43, No. 10, pp. 7187-7191 (2004); hereinafter Komettani et al.(1).*
Fabrication of Nano-Manipulator with SiO(2)DLC Hetero-Structure by Focused ion-Beam Chemical Vapor Deposition by R. Kumetani et al (2004 International. Microprocesses and Nanotechnology Conference Oct. 26-29, 2004, Japanese J. Applied Physics.*
Manipulation using 3-D Nano-Manipulator Fabricated by FIB-CVD in the Nano-Factory by R. Kumetani et al (2005 International. Microprocesses and Nanotechnology Conference Oct. 25-28, 2005, paper No. publisher is Inst. of Elec. and Elec. Eng. Computer Society, paper No. 1595324.*
International Search Report for International Application No. PCT/US2010/001204, dated Jan. 5, 2011.

(Continued)

Primary Examiner — Carl Arbes
(74) Attorney, Agent, or Firm — Edwards Wildman Palmer LLP; Peter F. Corless

(57) ABSTRACT

In one preferred aspects, methods are provided to produce a three-dimensional feature, comprising: (a) providing a nano-manipulator device; (b) positioning an article with the nano-manipulator device; and (c) manipulating the article to produce the three-dimensional feature. The invention relates to production of nanoscale systems that can be tailored with specific physical and/or electrical characteristics or need to have these characteristics modified. Methods and apparatus are presented that can construct three-dimensional nanostructures and can also modify existing nanostructures in three dimensions.

13 Claims, 3 Drawing Sheets

(56) References Cited

OTHER PUBLICATIONS

Written Opinion for International Application No. PCT/US2010/001204, dated Jan. 5, 2011.
Peng et al., "Bottom-up Nanoconstruction by the Welding of Individual Metallic Nanoobjects Using Nanoscale Solder," Nano Lett., 9(1):91-96 (2009).
Makarov et al., "Deposition of Narrow, High Quality, Closely Spaced, but Isolated Conductors," Proceeding of the 33rd International Symposium for Testing and Failure Analysis, Nov. 4-8, 2007, San Jose, CA, pp. 41-45.
Rubio-Sierra et al., "Nanomanipulation by Atomic Force Microscopy," Advanced Engineering Materials, 7(4):193-196 (2005).
International Search Report, International Application No. PCT/US2010/001204 (Jan. 5, 2011).
Written Opinion of the International Searching Authority, International Application PCT/US2010/001204 (Jan. 5, 2011).

\* cited by examiner

METHOD OF MAKING A 3-D STRUCTURE

This application claims the benefit of U.S. Provisional Application Ser. No. 61/171,403, filed Apr. 21, 2009, which is incorporated herein by reference in its entirety.

FIELD

In one preferred aspects, methods are provided to produce a three-dimensional feature, comprising: (a) providing a nano-manipulator device; (b) positioning an article with the nano-manipulator device; and (c) manipulating the article to produce the three-dimensional feature. The invention relates to production of nanoscale systems that can be tailored with with specific physical, optical and/or electrical characteristics or need to have these characteristics modified. Methods and apparatus are presented that can construct three-dimensional nanostructures and can also modify existing nanostructures in three dimensions.

BACKGROUND

Nanoscale Systems are currently being fabricated using many techniques adopted from the semiconductor and MEMS fields. These fabrication techniques create three dimensional structures by layering materials and patterning each layer (photolithography). Although such a process can create devices in parallel and thus produce large numbers of identical devices it is limited in its vertical scale capability. The aspect ratio (AR) of most planar processes is limited to a factor of a few units in the vertical dimension over the lateral dimension (AR of 3:1, for example). As the lateral dimension shrinks, so does the vertical and is confined to no more than an aspect ratio of 5:1 or so.

Reactive Ion Etching (RIE) has been pushed to achieve large aspect ratio via milling in nanoscale systems but it is limited to certain materials and the vertical walls cannot be made perpendicular. Subsequent process steps have to conform to the shape of the RIE formed process.

The materials that lend themselves to creating these structures are also limited to a few compounds and elements (silicon and its compounds, aluminum, titanium, copper, etc). Some of these compounds or elements are also incompatible with each other and have to be processed in special ways. For example, copper will diffuse in silicon and silicon dielectrics so it has to be completely encapsulated in a different material before it can be used in electrical circuits. This limits the scalability of copper in photolithographic processes.

In the area of structure modification, a very valuable application is circuit edit. Electronic semiconductor circuits have been modified in functionality and logic by using particle beam processes. However, these processes can only generate materials that are far inferior from the manufactured material (such as copper and dielectrics). See, generally, U.S. Pat. Nos. 7,297,946 and 5,364,497.

SUMMARY

In one aspect, the present invention mimics building construction techniques adapted to the nanoscale.

In a preferred aspect, instead of the planar process, methods and systems of the invention employ a "pick and place" system that can place prefabricated nano-wires or other nano-articles in position for construction in a manner analogous to beams that are welded together to form the frame of a building.

Apparatus useful in methods and systems of the invention may comprise a vacuum chamber where a staging area will hold the materials for construction. A nanomanipulator can act as the crane that will place the materials in position and an imaging system will provide the navigation information and energy for welding in the case of beam based direct-write CVD processing. Electrical and other feedthroughs can permit electrical fusing of nanostructures as an alternate or additional welding technique. "Bottom-up Nanoconstruction by the Welding of Individual Metallic Nanoobjects Using Nanoscale Solder", Yong Peng, Tony Cullis and Beverley Inkson. *Nano Lett.*, 2009, 9 (1), pp 91-96

These nanostructures (e.g. beams and wires) can be suitably fabricated and be of any of a large number of materials or compounds customized to the needs of the specific structure of interest. The pre-fabricated segments are nano-manipulated into position and beam based chemical vapor deposition processes can be used to fuse them together. A two beam system (electron and ion beams coincident on the sample) is suitably employed and exemplified herein.

Suitably, processing in methods and systems of the invention can be accomplished through a combination of beam based chemistry, special environmental conditions and electrical/electrochemical processes. A preferred approach is electron beam based chemical vapor deposition process, see "Deposition of Narrow, High Quality, Closely Spaced, but Isolated Conductors, V. V. Makarov and R. K. Jain, Proceedings of the 33$^{rd}$ International Symposium for Testing and Failure Analysis, Nov. 4-8, 2007, San Jose, Calif., pp 41-45. In situ sizing of raw material(s) can be easily done with one of the beams present and usually without any chemical assistance.

A specific application that will immediately benefit from such a methodology is circuit edit, the process of modifying the layout of an already fabricated integrated circuit.

In a preferred aspect, methods and systems of the invention can employ manufactured components in circuit edit thus providing identical quality of material to the manufactured component.

In a preferred aspect, methods for producing a three-dimensional feature are provided comprising: (a) providing a nano-manipulator device; (b) positioning an article with the nano-manipulator device; and (c) manipulating the article to produce the three-dimensional feature. Two or more articles may be suitably positioned with the nano-manipulator device. As discussed, in preferred aspects, semiconductor chip editing is performed with the nano-manipulator device.

As referred to herein a nano-sized feature or object will have a critical size (smallest dimension) that is less than 5,000 nm or 1000 nm, more typically less than 500 nm, even more typically 100 nm or less. For example, a wire that is 50 nm in diameter but several microns long is considered herein to be a nanowire. A layer of material that is many square microns in area but 100 nm thick is a nanolayer.

As referred to herein, "nano-manipulation" use of a "nano-manipulator device" or other similar term indicates modification, construction or creation of a three-dimensional structure, e.g. where at least two, three, four or more discrete members (e.g. nanotubes (including carbon nanotubes), nanowires) are rigidly affixed (e.g. affixing through a CVD, electrochemical process, and/thermal process). Such rigid affixing can increase volume and/or mass of each of the joined members. For instance, a first member (e.g. carbon nanotube or nanowire) upon nano-manipulation in accordance with the present invention may result in rigid affixing to one or more additional members and a volume and/or mass change of at least 5, 10, 20, 30, 40, 50, 60, 70, 80, 90, 100, 200, 300, 400, 500, 1000%. Nano-manipulation may be accomplished through incorporation of a variety of techniques (e.g. Computer Aided Design or CAD) but may include joint creation and/or volume and/or mass addition or subtraction to manipulated nano-objects.

Nano-manipulation as referred to herein may include (but is not limited to in the absence of a mass addition or subtraction) planar fabrication and processes involving moving nanoscale structures around for either imaging or to connect them to other nanostructures or to separate them from other nanostructures. For example, two nanowires grown apart can be nanomanipulated to either cross each other or make contact to electrical points in a circuit (such as pads). In another example, an electrical nano-probe is manipulated on to a metal pad or circuit line to electrically characterize it.

Other aspects of the invention are discussed infra.

DETAILED DESCRIPTION

Figure 1A:
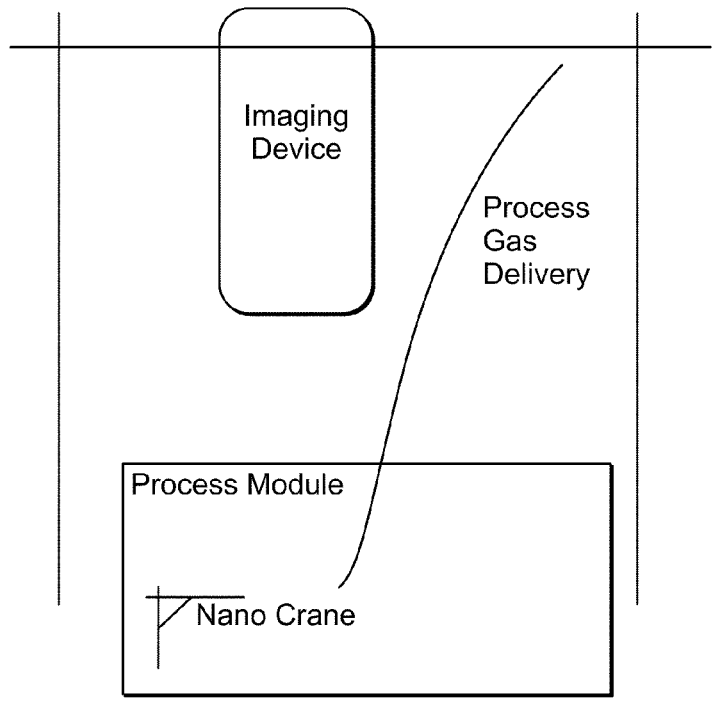
FIG. 1 (includes FIGS. 1a and 1b) shows a suitable nano construction apparatus where in FIG. 1(a) an overview is depicted and in FIG. 1(b) a process area with exemplary structure (beam with arc) is depicted.
Figure 1B:
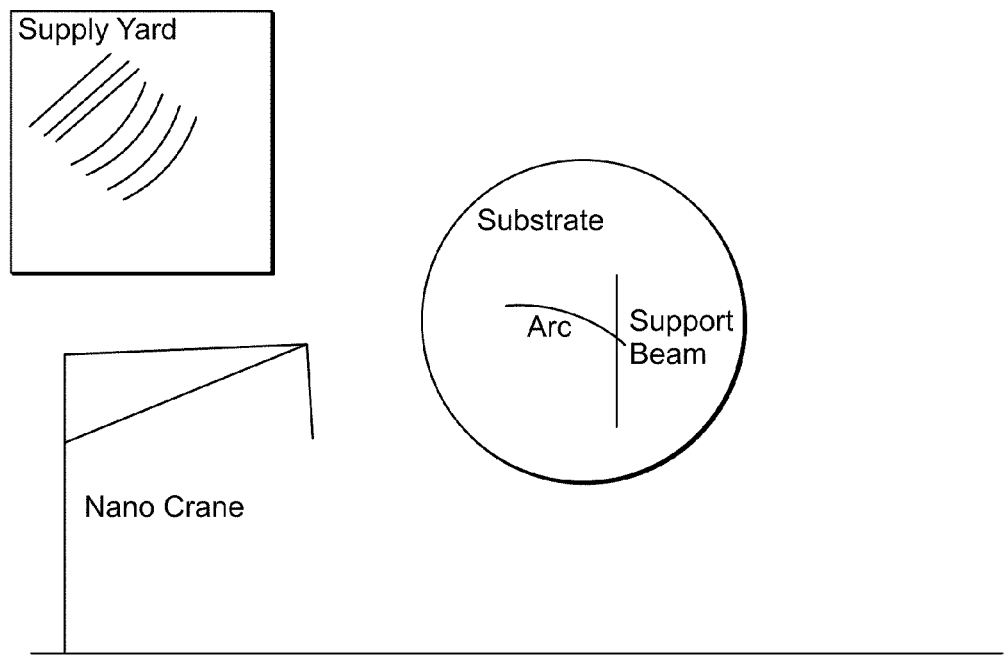

An apparatus and method for constructing complex nanoscale structures or modifying existing structures has been developed. This method uses integration of technologies such as nano particle beams (for example, SEM, FIB), beam based chemistry (CVD), nano-manipulators, environmental control, and computer aided design (CAD) files to construct, analyze and modify nanoscale systems.

Unlike the existing techniques that use planar fabrication methods extended to some limited three-dimensional capability, this nano-construction technique is capable of building complex three dimensional structures through building construction techniques adapted to nanoscale environments. For example, beams are made of nano tubes, cranes are nano-manipulators and welders are beam based CVD or electrochemical processing. The raw material can be for example carbon nanotubes, beams or lines cut out of bulk metal in-situ or ex-situ that can be curved or rectangular. Gaseous precursors are used for welding pieces together under the energy of the beam, etc.

In methods and systems of the invention, a variety of commercially available nano-manipulator devices (including e.g. nano-tweezers) may be employed including e.g. devices from Omniprobe (TEM sample prep device); Zyvex (Electrical Probing); Kleindiek (TEM sample prep and electrical probing); and Xidex (Nanomanipulation).

A wide nanoscale system can be created in accordance with methods and systems of the invention. More specifically, particularly suitably applications for methods and systems of the invention include
1) Circuit Edit;
2) Construction of nano-electrical mechanical systems (NEMS), including placing gears and electrical components together to assemble a NEMS;
3) Photonic systems. Construction of complex nanoscale structures for optical systems (optical guides, wave guides, fiber splicers etc.);
4) Construction of sensors. For example, an electrical system can have a sensor to measure electrical resistivity inside a cell. This sensor has to be attached to the electrical circuit;
5) Medical nanodevices (these are often called NEMS, but can be different than above discussed NEMS). For example, a fluidic device that separates different particles from within a fluid or mixes fluids etc.;
6) Synthetic biology.

In accordance with the invention, nano manipulators can position beams in such a way that they can be welded and structures built in a manner very similar to building construction. Overhanging, retrograde, high aspect ratio features are all easily built with this technique.

Several components of this invention have already been integrated into one system but others have to be further developed and integrated. Existing nanomanipulators lack the positioning accuracy for the finest range of nanoscale accuracy and electrochemical fusing processes are an alternative to CVD welding that show a lot of promise but not yet fully developed. "Nanomanipulation by Atomic Force Microscopy, F. J. Rubio-Sierra 1, W. M. Heckl 1 2, R. W. Stark *, 1Ludwig-Maximilians-Universität München, Kristallographie and Center for Nanoscience CeNS, Theresienstr. 41, 80333 Munich, Germany, Deutsches Museum, Museumsinsel 1, 80538 Munich, Germany, Advanced Engineering Materials, Volume 7 Issue 4, Pages 193-196, Published Online: 21 Apr. 2005. Also, temperature control can have a positive effect in beam based processing; consequently, that aspect of the environmental control may become important.

Referring now to the drawings, in one preferred method, a substrate is placed in a holder (FIG. 1(a)) that incorporates at least one nano-crane and is placed inside a beam system with beam chemistry capability and CAD navigation. The holder is designed to be a complete construction site ready with beams of pre-cut metal, metal blocks for in-situ cutting of custom pieces, plates of insulator, a supply of carbon nanotubes (CNT's), spare nano-manipulator parts and space for custom supplies. The nano-crane may be any of a variety of nano-manipulation tools, including commercially available nano-manipulators, such as a Zyvex L100™, which may include an x-nano-positioner and a y-nano-positioner for nano-positioning of a nano-article in the x and y directions. The nano-manipulator may be used for manipulation of the specimen in any of x, y or z directions.

The length of wire needed in the construction is either immediately available or is cut to size with the system beam. It is then attached to the nano-manipulator, moved to the desired location and fused to the system under construction.

In one specifically preferred system, methods of the invention were conducted in a nanofabrication facility and in a two beam (FIB/SEM) system outfitted with a nanomanipulator. Using nanofabrication, wires are constructed as needed to connect the center of a disk to a pad so that the center of the disk could be grounded. The surface of the disk is covered with dielectric everywhere except the center where the doped silicon below is exposed.

Figure 2:
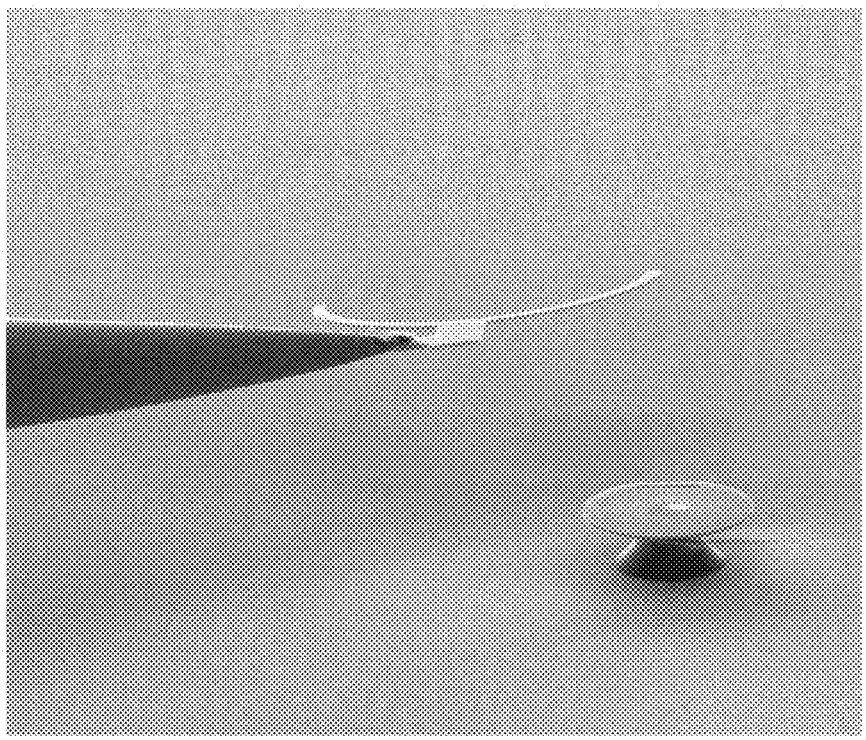
FIG. 2 shows a prefabricated nanowire which has been welded to the nanomanipulator and is being moved to the area of interest.

As depicted in FIG. 2, a prefabricated nanowire is moved to the disk area. The wire is suitably designed to have a tab for attachment to the nanomanipulator. The tab is cut off once the wire is attached to the system.

Figure 3:
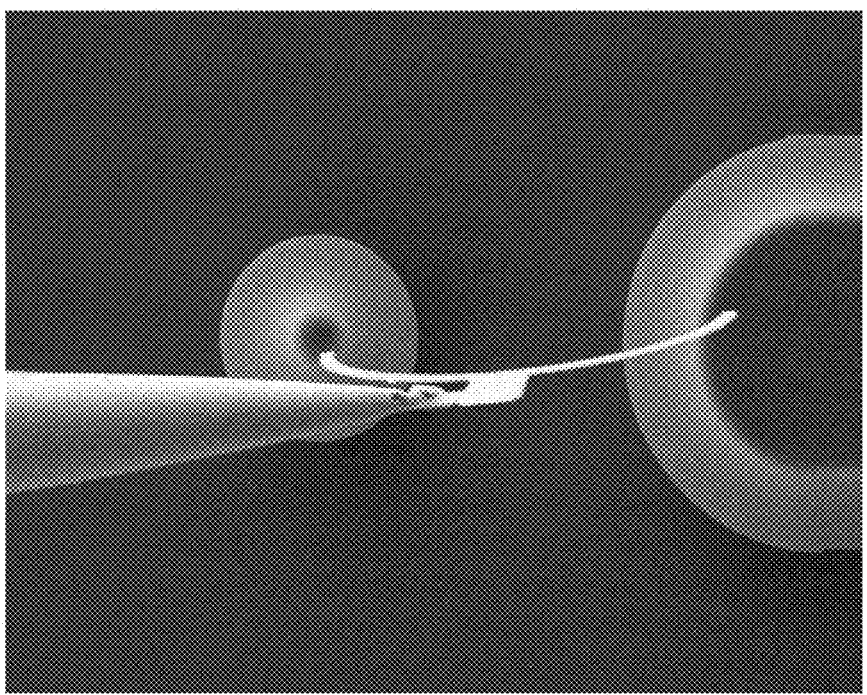
FIG. 3 shows the nanowire has been placed into position and is ready for welding.
Figure 4:
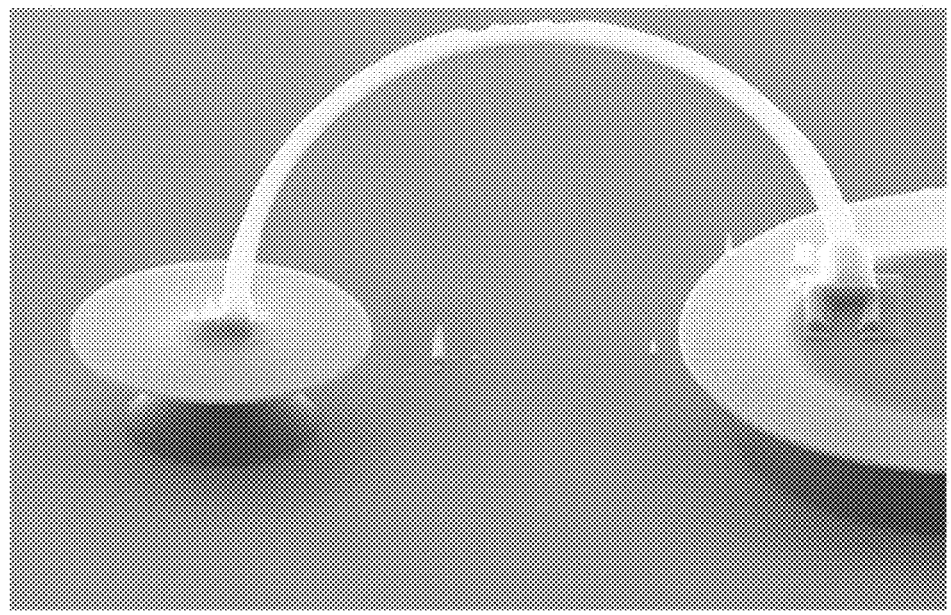
FIG. 4 shows the nanowire has been welded in position.

Next, shown in FIG. 3, the wire is in position for welding and in FIG. 4 the wire has been welded using E-Beam CVD. As shown in FIG. 4, the nanowire is welded in position.

Figure 5:
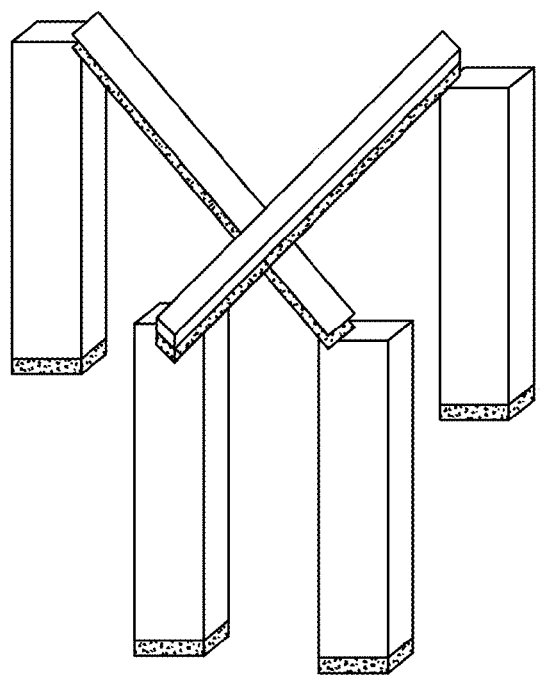
FIG. 5 shows beams crossed in air.

The ability to connect additional structures to such a beam has been successfully carried out and with proper design structures can be built up into heights and complexities not attainable through planar processing. FIG. 5 depicts an example of a structure that would be impossible to build in planar processing where pillars are connected by crossing beams that are not touching.

As discussed above; circuit editing applications are preferred aspects of the invention. A specific application of nano-construction is for the editing of integrated circuits. The ultimate verification of a circuit design is in a system after the part is manufactured. Currently, FIB systems are routinely used to edit circuits once first silicon is produced so that fixes and improvements can be tested out without running through the manufacturing process. The nano-construction technique and system are adaptable to future generations of circuit editing because not only are dimensions scaling down but also material properties are becoming increasingly critical (for example, metal re-wiring resistance).

The following Table 1 is a summary of specifications that are currently state of the art and with existing techniques cannot be adequately bridged to meet the needs for many of the edits encountered already and will be even further behind in future generation of circuits.

TABLE 1

Comparison of critical specifications using extended state of the art technologies and nanoconstruction

| Objective | Figure of Merit | State-of-the-art | Nanoconstruction Capability |
|---|---|---|---|
| Metal Deposition | Line Width | 100 nm | 10 nm |
| | Line Pitch | 200 nm | 20 nm |
| | Resistivity | 200 μΩcm | 2 μΩcm |
| Dielectric Deposition | Resistivity | $10^9$ μΩcm | $10^{15}$ μΩcm |
| | Dielectric Constant (k) | Unknown | ~2 |
| Speed of deposition | 10 um × 1 um × 1 um | 15 minutes | 5 minutes to place and weld |

Custom wires (e.g. metal nanowires such as copper nanowires, semiconductor nanowire such as a silicon nanowires and other such as an indinium-containing nanowire) can be cut from bulk metal and placed where the editing needs to be routed. Resistance can be as desired and only the ends are fused/welded with impure deposition material adding minimal resistance to the edit.

Nanowires or carbon nanotubes can be inserted directly into vias and make contact with metal interconnect or even active areas or circuit contacts. CNT's that are insulating on the outside and conductive on the inside are ideal for inserting in vias to connect to underlying metal. Alternatively, an insulating coating can be deposited in the via to insulate a nanowire inserted to contact underlying interconnect.

It is often desired to run multiple edit lines of interconnect with very tight pitch (sub 100 nm). Nanowires or CNT's can be layed out in such a fashion eliminating the issues that arise from direct write deposition techniques. Where wire might have to cross, a dielectric pad can be positioned between the crossing wires.

This technique can overcome limitations with interconnect material deposition and others. Edits that are speed sensitive can be done without adjustments or limitations that current technologies impose.

The following terms and abbreviations mean the following as used herein:

CVD—Chemical Vapor Deposition. In this context we are referring to a beam induced CVD using an organometalic precursor such as Tungsten Hexa Carbonyl
FIB—Focused Ion Beam
SEM—Scanning Electron Microscope
CAD—Computer Aided Design. Electronic data file with structural information
CNT—Carbon nanotube
RIE—Reactive Ion Etching All documents mentioned herein are incorporated by reference herein in their entirety. The following non-limiting Example is illustrative of the invention.

EXAMPLE 1

A 10 micrometer diameter disk on a pedestal had its center connected to a ground terminal using a prefabricated nano-bridge. The center of the disk had to be connected to the ground terminal while avoiding any disturbance of the insulating material over the rest of the disk. A curved beam was fabricated from silicon and was then cut from the substrate using focused ion beam (FIB) milling and then lifted with a nanomanipulator after welding the beam to the nanomanipulator using electron beam (E-Beam) chemical vapor deposition. The beam was then placed in position to ground the center of the disk and was welded to the disk and the substrate again using E-Beam chemical vapor deposition. The beam was then cut loose from the nanomanipulator using FIB milling.

What is claimed is:

1. A method for producing a three-dimensional structure, the method comprising:
   (a) providing a nano-manipulator device;
   (b) affixing a first article to the nano-manipulator device using electron-beam chemical vapor deposition;
   (c) positioning the first article with the nano-manipulator device onto a second article;
   (d) affixing the first article to the second article using electron-beam chemical vapor deposition, thereby producing the three-dimensional structure, wherein a mass of the first article is increased by at least 10 percent via the electron-beam chemical vapor deposition.

2. The method of claim 1, further comprising:
   (e) separating the first article from the nano-manipulator device.

3. The method of claim 2 wherein the first article is separated from the nano-manipulator device by focused ion beam milling.

4. The method of claim 1 wherein the first and second articles are selected from the group consisting of: a microelectronic device, a substrate to form a nano-electrical mechanical system, a photonic system substrate, a sensor substrate, and -a medical nanodevice.

5. The method of claim 1 or 4 wherein two or more articles are positioned with the nano-manipulator device.

6. The method of claim 1 wherein a semiconductor chip editing is performed with the nano-manipulator device.

7. The method of claim 1 wherein the mass of the first article is increased by at least 30 percent via the electron-beam chemical vapor deposition.

8. A method for producing a three-dimensional structure, the method comprising increasing mass of one or more nano-sized articles by using electron-beam chemical vapor deposition to affix one or more additional members to the one or more nano-sized articles, thereby producing the three-dimensional structure, wherein the mass of the one or more articles is increased by at least 10 percent via the electron-beam chemical vapor deposition.

9. The method of claim 8 wherein the mass of one or more articles is increased by at least 30 percent by the electron-beam chemical vapor deposition.

10. The method of claim 8 or 9 wherein the three-dimensional structure is selected from the group consisting of: a microelectronic device, a substrate to form a nano-electrical mechanical system, a photonic system substrate, a sensor substrate, and a medical nanodevice.

11. A method for producing a three-dimensional structure, comprising rigidly affixing two or more discrete nano-members using electron-beam chemical vapor deposition, wherein a mass of a particular member is increased by at least 10 percent via the electron-beam chemical vapor deposition.

12. The method of claim 11 wherein the two or more members are rigidly affixed with a nano-manipulator device.

13. The method of claim 11 or 12 wherein the two or more members are nanotubes and/or nanowires.

* * * * *